United States Patent
Umeno et al.

(10) Patent No.: US 8,957,313 B2
(45) Date of Patent: Feb. 17, 2015

(54) MULTILAYER STRUCTURE, AND ELECTRODE FOR ELECTRICAL CIRCUIT USING THE SAME

(75) Inventors: Satoshi Umeno, Chiba (JP); Katsunori Honda, Chiba (JP); Kazuyoshi Inoue, Chiba (JP); Masato Matsubara, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 125 days.

(21) Appl. No.: 12/162,028

(22) PCT Filed: Jan. 16, 2007

(86) PCT No.: PCT/JP2007/050497
§ 371 (c)(1),
(2), (4) Date: Jul. 24, 2008

(87) PCT Pub. No.: WO2007/086280
PCT Pub. Date: Aug. 2, 2007

(65) Prior Publication Data
US 2009/0008124 A1  Jan. 8, 2009

(30) Foreign Application Priority Data
Jan. 25, 2006  (JP) .................. 2006-016974

(51) Int. Cl.
| | |
|---|---|
| *H01B 13/00* | (2006.01) |
| *C23C 14/08* | (2006.01) |
| *G02F 1/1343* | (2006.01) |
| *H01J 9/02* | (2006.01) |
| *G02F 1/1362* | (2006.01) |
| *H01L 51/52* | (2006.01) |

(52) U.S. Cl.
CPC .......... *C23C 14/086* (2013.01); *G02F 1/13439* (2013.01); *H01J 9/02* (2013.01); *G02F 2001/13629* (2013.01); *H01L 51/5206* (2013.01)
USPC ....................................... 174/126.2

(58) Field of Classification Search
USPC .................. 174/94 R, 126.1, 126.2
See application file for complete search history.

(56) References Cited

U.S. PATENT DOCUMENTS

| | | | |
|---|---|---|---|
| 5,366,588 A | 11/1994 | Scholten et al. | |
| 5,981,972 A * | 11/1999 | Kawai et al. | 257/59 |
| 6,280,861 B1 | 8/2001 | Hosokawa et al. | |
| 6,373,546 B1 | 4/2002 | Kim | |
| 6,614,500 B2 | 9/2003 | Kim | |
| 6,617,056 B1 * | 9/2003 | Hara et al. | 428/697 |
| 6,624,864 B1 | 9/2003 | Kubo et al. | |
| 6,788,355 B1 | 9/2004 | Ihida et al. | |

(Continued)

FOREIGN PATENT DOCUMENTS

| | | |
|---|---|---|
| EP | 0 560 442 | 9/1993 |
| EP | 1 975 273 | 1/2008 |

(Continued)

OTHER PUBLICATIONS

International Search Report, PCT/JP2007/050597, Feb. 3, 2010.

(Continued)

*Primary Examiner* — Chau N Nguyen
(74) *Attorney, Agent, or Firm* — Millen, White, Zelano & Branigan, P.C.

(57) ABSTRACT

A multilayer structure including a transparent conductive thin film and a molybdenum metal thin film, the transparent conductive thin film having a thickness of 35 nm or less.

8 Claims, 2 Drawing Sheets

(a)

(b)

(56) References Cited

U.S. PATENT DOCUMENTS

| | | |
|---|---|---|
| 7,320,906 B2 | 1/2008 | Park et al. |
| 2002/0018176 A1* | 2/2002 | Kobayashi et al. ............ 349/200 |
| 2002/0101548 A1 | 8/2002 | Kim |
| 2004/0081836 A1 | 4/2004 | Inoue et al. |
| 2005/0110014 A1 | 5/2005 | Park et al. |
| 2005/0190322 A1 | 9/2005 | Okabe et al. |
| 2005/0238963 A1* | 10/2005 | Ishibashi et al. ................ 430/5 |
| 2008/0093600 A1 | 4/2008 | Park et al. |

FOREIGN PATENT DOCUMENTS

| | | |
|---|---|---|
| JP | 6-60744 A2 | 3/1994 |
| JP | 07-64112 A | 3/1995 |
| JP | 07-64112 W | 3/1995 |
| JP | 10-253992 A | 9/1998 |
| JP | 2000-180840 A | 6/2000 |
| JP | 2000-180840 W | 6/2000 |
| JP | 2001-125134 A | 11/2001 |
| JP | 2002-43577 A | 2/2002 |
| JP | 2002-43577 W | 2/2002 |
| JP | 2004-68054 A | 3/2004 |
| JP | 2005-62889 A | 3/2005 |
| JP | 2005 277402 | 10/2005 |
| WO | 2007086280 R | 5/2007 |

OTHER PUBLICATIONS

Office Action for related Japanese Patent Application No. 2007 555892 issued Jul. 24, 2012.

Mitsubishi Gas Chem Co Inc., "Etching composition for laminated film included reflective electrode film and method for forming laminated wiring structure," Patent Abstracts of Japan, Publication Date: Oct. 6, 2005; English Abstract of JP-2005 277402.

* cited by examiner (a)

(b)

MULTILAYER STRUCTURE, AND ELECTRODE FOR ELECTRICAL CIRCUIT USING THE SAME

TECHNICAL FIELD

The invention relates to a multilayer structure comprising a transparent conductive thin film and a molybdenum metal thin film, and an electrode for an electrical circuit using the same. More particularly, the invention relates to various transparent thin films containing indium oxide, a multilayer structure comprising an indium oxide-tin oxide (ITO) thin film and a molybdenum metal thin film, and an electrode for an electrical circuit using the same.

BACKGROUND

A thin film obtained by stacking an ITO thin film and a molybdenum thin film is used as part of an electrical circuit of a liquid crystal display or other electric devices. It is known that, when a molybdenum thin film is formed on an ITO thin film, internal stress is generated in each of the formed thin films, causing the films to be peeled off or broken. The internal stress is divided into two stresses; tensile stress and compression stress. Here, the tensile stress is stress generated in a thin film when the formed film surface is depressed, and the compression stress is stress generated in a thin film when the formed film surface is projected. Normally, an ITO film is subjected to compression stress and a metal thin film (especially a molybdenum thin film) is subjected to tensile stress. If these thin films are stacked under such stresses, these thin films eventually peel off or break, since not only the type of stress is different (compression and tensile), but also the degree of difference in stress becomes large between compression stress and tensile stress, thereby causing a significant degree of warping to be generated at the interface.

As stated above, due to poor adhesiveness between an ITO thin film and a molybdenum thin film, these films are cracked or broken. Since the ITO film was thick, a reverse taper occurs after etching. When an amorphous ITO (a-ITO) is formed, the a-ITO is polycrystallized by heating at a postbake process or at a SiNx film formation process by a CVD method after etching. Since the polycrystallized ITO has poor adhesiveness with a molybdenum film, cracking or breakage of these films occurs. Such cracking and breakage increases defectiveness in products and decreases production yield (Patent Document 1).

In order to solve the above-mentioned problem, a method is disclosed in which complicated steps are combined to produce a multilayer film which is free from peeling and breakage. This method is, however, disadvantageous since production yield is lowered due to increased production steps (Patent Document 2).

For example, in a polycrystalline ITO (p-ITO) method, a multilayer body is produced by depositing a p-ITO film using a vacuum sputtering apparatus, etching the resulting ITO film, depositing a film of molybdenum thereon by means of a sputtering apparatus, and etching the resulting molybdenum film. This method is complicated since film deposition and etching are repeated twice, and hence suffers from poor productivity.

Under such circumstances, a technique has been demanded in which the processes of film formation and etching can be simplified while preventing cracking and breakage of an ITO thin film and a molybdenum thin film caused by stress between the films.

Patent Document 1: JP-A-10-253992
Patent Document 2: JP-A-2005-62889

The invention has been made in view of the above-mentioned problem. An object of the invention is to provide a multilayer structure which contributes to a decrease in product defectiveness ascribable to cracking between or breakage of wiring materials, as well as to improvement of production yield.

Another object of the invention is to provide an electrode for an electrical circuit comprising the above-mentioned multilayer structure.

A further object of the invention is to provide an electric device comprising the above-mentioned multilayer structure or the above-mentioned electrode for an electrical circuit.

SUMMARY OF THE INVENTION

The inventors have made intensive studies to solve the subject, and as a result, have found that, adhesiveness between a transparent conductive thin film and a molybdenum metal thin film can be improved by causing the thickness of the transparent conductive thin film to be 35 nm or less. By doing this, not only cracking and wiring breakage can be prevented, but also production yield can be improved due to simplification of production steps. This finding has led to the completion of the invention.

The invention provides the following multilayer structure or the like.

1. A multilayer structure comprising a transparent conductive thin film and a molybdenum metal thin film,
the transparent conductive thin film having a thickness of 35 nm or less.
2. The multilayer structure according to 1 wherein the transparent conductive thin film is a thin film containing indium oxide and tin oxide.
3. The multilayer structure according to 1 wherein the transparent conductive thin film is a thin film containing indium oxide, tin oxide and zinc oxide.
4. The multilayer structure according to 1 wherein the transparent conductive thin film is a thin film containing indium oxide and an oxide of a rare earth element.
5. The multilayer structure according to any one of 1 to 4 wherein a taper angle of the transparent conductive thin film is less than 90°.
6. An electrode for an electrical circuit comprising the multilayer structure according to any one of 1 to 5.
7. An electronic device comprising, as at least part thereof, the multilayer structure according to any one of 1 to 5 or an electrical circuit comprising the electrode for an electrical circuit according to 6.

The invention can provide a multilayer structure capable of contributing to a decrease in product defectiveness ascribable to cracking between wiring materials or wiring breakage as well as improvement in production yield.

The invention can provide an electrode for an electrical circuit comprising the multilayer structure.

The invention can provide an electronic device comprising the multilayer structure or the electrode for an electrical circuit.

BEST MODE FOR CARRYING OUT THE INVENTION

Figure 1:
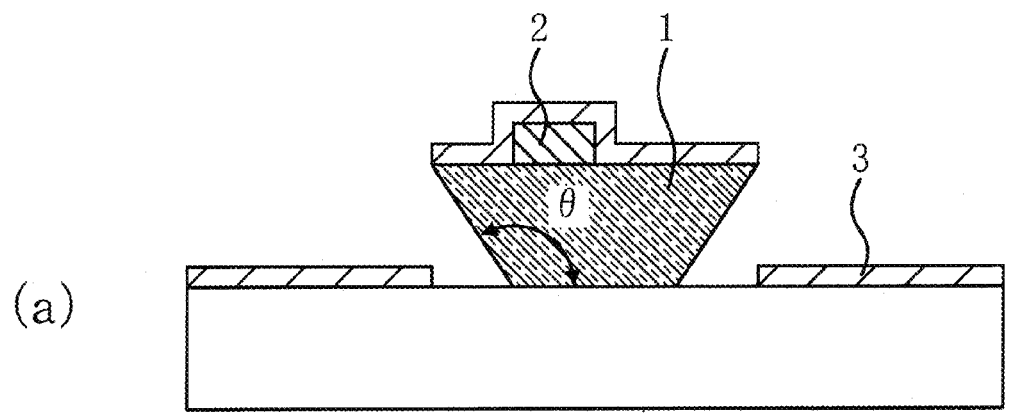
FIG. 1(a) is a schematic view showing an ITO film having a taper angle θ of 90° or more.
FIG. 1(b) is a schematic view showing an ITO film having a taper angle θ of less than 90°.
Figure 1:
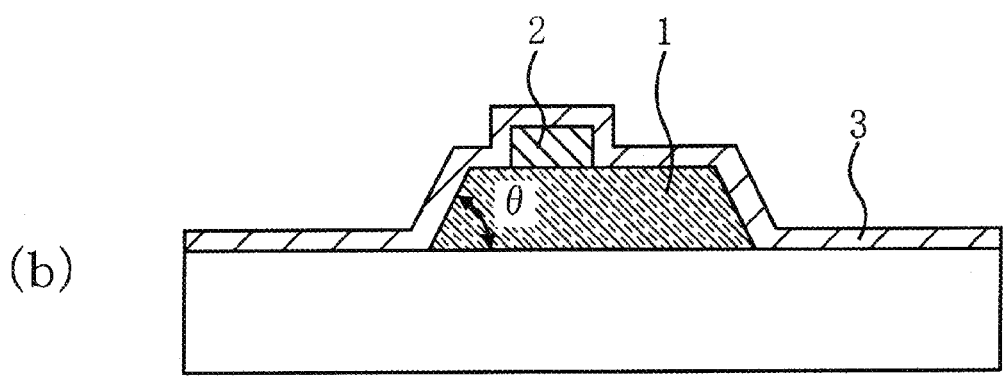

The multilayer structure of the invention is a thin film obtained by stacking a transparent conductive film and a molybdenum thin metal film, and hence it can be called a multilayer thin film. The multilayer structure is normally formed by stacking on a substrate a transparent conductive thin film and a molybdenum metal thin film in this order. Also, the multilayer structure of the invention can be formed by stacking on a substrate a molybdenum metal thin film and a transparent conductive thin film in this order. In the multilayer structure of the invention, each layer may be patterned in a desired shape. That is, the multilayer structure of the invention can be formed if each of the transparent conductive thin film and the molybdenum metal thin film is patterned in a required shape and at least part of the resulting patterns is overlapped.

The thickness of the transparent conductive thin film is 35 nm or less, preferably 30 nm or less, more preferably 25 nm to 1 nm. The transparent conductive thin film having a thickness of 35 nm or less enables adhesiveness with the molybdenum metal thin film to be improved. The reason appears to be that the reduced thickness of the transparent conductive thin film lowers warping at the interface with the molybdenum metal thin film caused by compression stress of the transparent conductive thin film, and the compression stress itself is reduced.

The thickness of the molybdenum metal thin film is normally 10 to 500 nm, preferably 20 to 200 nm. The thickness of the molybdenum metal film can be selected according to application.

Although there are no particular restrictions on the substrate, glass, quarts, plastics or the like are normally used.

There are no particular restrictions on the transparent conductive thin film, insofar as it is transparent and conductive. The transparent conductive thin film is a thin film containing one or two or more oxides selected from the group consisting of indium oxide, tin oxide, zinc oxide and an oxide of a rare earth element. Preferably, the transparent conductive thin film is a thin film containing indium oxide and one or two or more oxides selected from the group consisting of tin oxide, zinc oxide and an oxide of a rare earth element. The transparent conductive thin film is preferably a thin film containing indium oxide and tin oxide, a thin film containing indium oxide, tin oxide and zinc oxide or a thin film containing indium oxide and an oxide of a rare earth element.

Specific examples of the transparent electrode thin film of the invention include an indium oxide-tin oxide (ITO) thin film, an indium oxide-tin oxide-zinc oxide (ITZO) thin film, an indium oxide-cerium oxide (ICO) thin film and an indium oxide-samarium oxide (ISmO) thin film.

If the transparent electrode thin film contains a plurality of oxides, these oxides are normally used in the form of a composite oxide. However, as long as the transparent electrode thin film has transparency and conductivity which are high enough to be used as a transparent electrode, these oxides may be a compound or a mixture.

If the transparent electrode thin film of the invention is a thin film containing indium oxide and tin oxide, it is normally desired that they form a composite oxide of indium oxide and tin oxide. Although there are no particular restrictions, the weight ratio of each oxide is normally 80:20 to 99:1, preferably 85:15 to 95:5. Outside this range, transparency or conductivity may be lowered, and insufficient etching or poor electrical connection may occur.

If the transparent electrode film is a thin film containing indium oxide, tin oxide and zinc oxide, it is desired that they form a composite oxide of indium oxide, tin oxide and zinc oxide. The weight ratio of indium oxide and the total of tin oxide and zinc oxide is normally 50:50 to 99:1, preferably 60:40 to 95:5. Outside this range, transparency or conductivity may be lowered, and insufficient etching or poor electrical connection may occur.

If the transparent electrode film is a thin film containing indium oxide and an oxide of a rare earth element, it is desired that they form a composite oxide of indium oxide and tin oxide. The weight ratio of each oxide is normally 80:20 to 99:1, preferably 90:10 to 98:2 without any restrictions. Outside this range, transparency or conductivity may be lowered, and insufficient etching or poor electrical connection may occur.

The taper angle of the transparent conductive thin film is preferably less than 90°, more preferably 45 to 890, further more preferably 60 to 85°. The taper angle is an angle formed at the time of patterning such as etching of the transparent conductive thin film.

If the taper angle of the transparent conductive thin film is 90° or more, there are the following disadvantages. For example, as shown in FIG. 1(a), in the case where an SiNx thin film 3 is formed on a patterned ITO film 1 and Mo film 2 by a CVD method, coverage by the SiNx thin film 3 is insufficient when the taper angle of the ITO film 1 is 90° or more. That is to say, there is formed a portion of the ITO film 1 to which the SiNx thin film 3 does not attach (the parts shadowed by the overhangs formed by the ITO film 1 having a taper angle of 90° or more), leading to poor insulation or ITO corrosion caused by air, moisture or the like. However, as shown in FIG. 1(b), coverage by the SiNx thin film 3 is not sufficient when the taper angle of the ITO film 1 is less than 90°. Too small a taper angle θ substantially increases the line width of ITO wiring, and then patterning definition evaluated by L/S (line-and-space) is impaired, making the wiring unusable from a practical view point.

Figure 2:
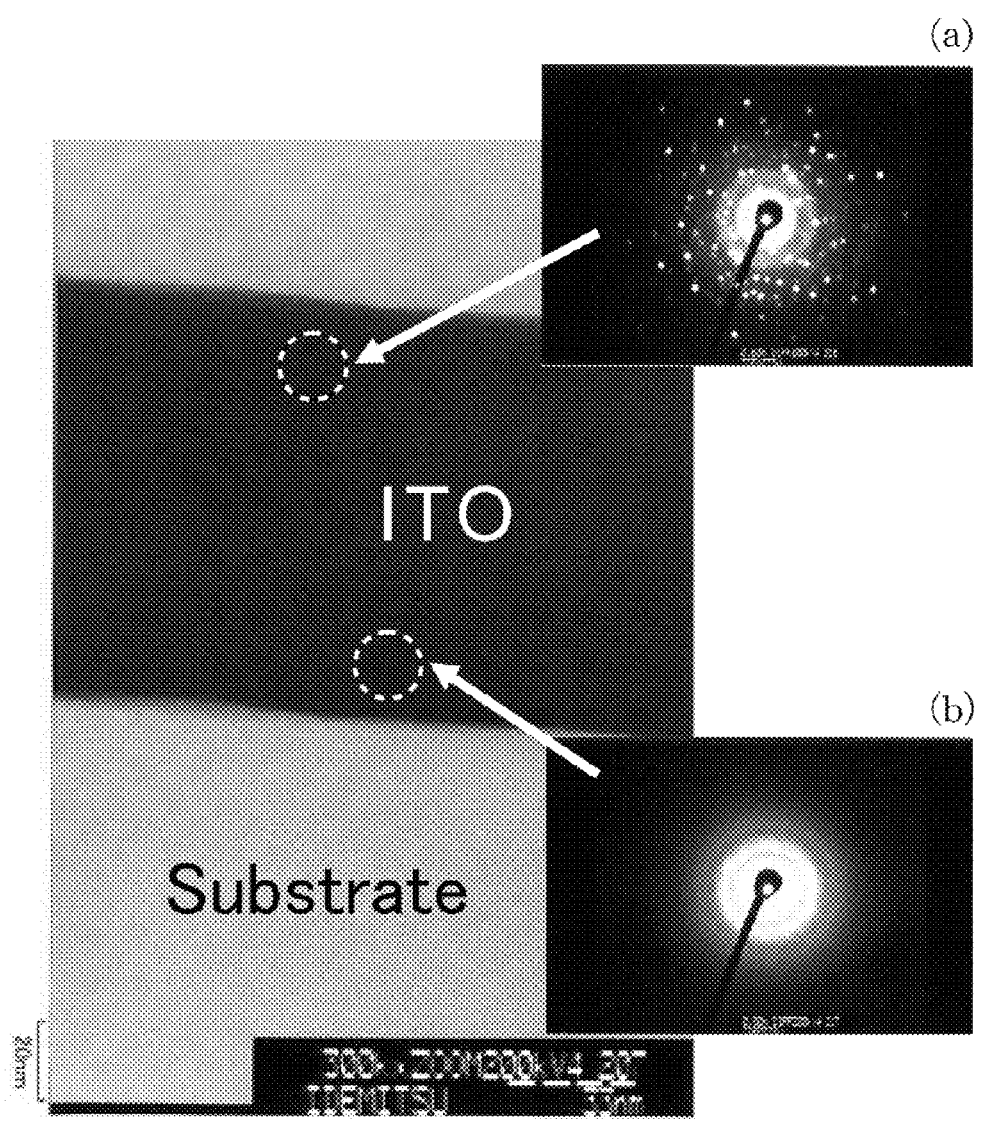
FIG. 2(a) is an electron diffraction image showing that the thick part of an ITO film is crystal-like, FIG. 2(b) is an electron diffraction image showing that the thin part of the ITO film is amorphous.

When an amorphous ITO thin film is formed on a glass substrate, the amorphous ITO thin film progressively exhibits crystallinity as the film formation proceeds. When the film thickness exceeds 35 nm, a crystal-like structure begins to generate, and the crystal-like structure comes to be shown in a part of the amorphous ITO. Therefore, if the thickness of an ITO thin film is 35 nm or less, the entire ITO thin film is amorphous and has a taper angle of less than 90°. FIG. 2(a) is an electron diffraction image showing that the thick part of the ITO film, which is away from a substrate, is crystal-like, and FIG. 2(b) is an electron diffraction image showing that the thin part of the ITO film, which is close to the substrate, is amorphous. In FIG. 2(a), though the ITO film was amorphous and a crystal diffraction pattern could not be confirmed before measurement, a part of ITO was crystallized by an electron beam during the measurement and a crystal diffraction pattern was confirmed. The results revealed that the thick part of the ITO film had a crystal-like structure. On the other hand, in FIG. 2(b), an electron beam diffraction image did not change and a crystal diffraction pattern could not be confirmed before and after the electron beam analysis. The results revealed that the thin part of the ITO film was entirely amorphous. For the same reason, an ITZO thin film having a thickness of 35 nm or less which is not crystallized by annealing is caused to have a taper angle of less than 90°.

In the case of ITO, since a substrate with a patterned ITO is heated at a postbake process or an SiNx process, the ITO changes to a polycrystalline ITO (p-ITO) even if ITO is an amorphous ITO (a-ITO). In the case of ITZO, ITZO is not crystallized by heating at a postbake process or an SiNx process. That is to say, the multilayer structure of the invention may be crystalline or amorphous.

The molybdenum metal thin film may be composed of a molybdenum monolayer or multiple layers such as a molybdenum/aluminum/molybdenum multilayer.

The multilayer structure of the invention can be produced by forming the transparent conductive thin film and molybdenum metal thin film by sputtering. As for the film conditions, the discharge gas pressure is normally 0.1 to 1 Pa, and the substrate temperature is normally room temperature to 400° C. Normally, it is desirable that the film formation gas be argon, or a mixture of argon and oxygen.

Specific examples of the method for producing the multilayer structure of the invention include the following method (amorphous ITO (a-ITO) method).
1. Forming an a-ITO film and a molybdenum film using a vacuum sputtering apparatus
2. Applying a resist, followed by exposure and development
3. Etching molybdenum with a PAN (phosphoric acid/acetic acid/nitric acid)-based etchant
4. Etching a-ITO with an oxalic acid-based etchant
5. Applying a resist, followed by exposure, development and heating
6. Etching molybdenum with a PAN (phosphoric acid/acetic acid/nitric acid)-based etchant
7. Stacking an SiNx film by the CVD method (300° C.)

As stated above, conventionally, in stacking the ITO film and the molybdenum film, cracking and wiring breakage occur due to weak attachment between these two films. Since the ITO film was thick, a reverse taper occurs after etching. When an amorphous ITO (a-ITO) is formed, the a-ITO is polycrystallized to p-ITO by heating at a postbake process or at a SiNx film formation process by the CVD method after etching. Since the p-ITO does not sufficiently attach to a molybdenum film, cracking or breakage of these films occurs. Therefore, conventionally, the film formation process 1 mentioned above is required to be a multi-stage process. However, according to the production method of the invention, no stress is generated at the interface due to strong adhesiveness between the ITO film and the molybdenum film, and cracking and wiring breakage do not occur. Accordingly, film formation is simplified to a single step, resulting in an improved production yield.

Using the multilayer structure of the invention, an electrode for an electrical circuit, as well as an electrical circuit, can be produced. They can be used in an electronic device.

For example, the multilayer structure of the invention can be used as an electrical circuit of electronic devices such as liquid crystal displays, organic electroluminescence devices and plasma display panels.

EXAMPLES

Examples of the invention are shown below, which should not be construed as limiting the scope of the invention. Various modifications and variations can be made appropriately according to application.

Example 1

In a magnetron sputtering apparatus, an ITO target (indium oxide:tin oxide=90:10 wt %) having a diameter of 4 inches and a Mo target (purity of 99.99%) having a diameter of 4 inches were installed. A 10 nm-thick ITO thin film was formed on a 10 cm-square glass substrate, and then a 150 nm-thick Mo thin film was formed thereon.

The thicknesses of the above films were measured with an optical thin film measurement system (Film Tek 4000 supplied by SCI Co.) and thickness meter (Dektak 8 supplied by ULVAC, Inc.)

The ITO thin film formation conditions were as follows:
Substrate temperature: Room temperature
Type of gas used for film formation: 89% of argon, 9% of hydrogen, and 2% of oxygen
The pressure: 0.1 Pa
The Mo thin film formation conditions were as follows:
Substrate temperature: Room temperature
Type of gas used for film formation: 100% of argon
The pressure: 0.2 Pa The resulting multilayer body was notched in squares, and the tape peel test was conducted to confirm the peeling state.

The following scratch test was conducted.

As the scratch tester, a micro-scratch-tester supplied by CSME was used. The conditions for measuring the peel strength were as follows:
Scratch distance: 20 mm
Scratch load: 0 to 10 N (Newton)
Load rate: 10 N/min
Scratch rate: 20 mm/min
Shape of diamond cone: Having a diameter of 200 μm at the front end The specimen after the scratch test under the above-mentioned conditions was observed by means of an optical microscope. The point where the underlying transparent conductive thin film (ITO film) was exposed was taken as the point where the Mo thin film was peeled (after confirming the transparent conductive film was not peeled). The distance from the point at which the scratch started was measured to calculate the peeling load.

The results are shown in Table 1.

Examples 2 and 3

Multilayer bodies were produced and evaluated under the same conditions as those in Example 1, except that the thicknesses of the ITO film was changed to those as in Table 1.

Example 4

A multilayer body of an ITZO film and an Mo film was produced and evaluated under the same conditions as those in Example 1, except that an ITZO (indium oxide:tin oxide:zinc oxide=65:20:15 wt %) target having a diameter of 4 inches was used and the thickness of the ITZO film was changed to those as shown in Table 1.

Comparative Examples 1 and 2

A multilayer body was produced and evaluated under the same conditions as those in Example 1, except that the thicknesses of the ITO film was changed to those as shown in Table 1.

TABLE 1

| | Trasnparent electrode | Thickness (nm) | Tape peel test | Scratch peel test (N) |
|---|---|---|---|---|
| Example 1 | ITO | 10 | No peeling occurred | 8.72 |
| Example 2 | ITO | 20 | No peeling occurred | 8.59 |
| Example 3 | ITO | 30 | No peeling occurred | 7.37 |
| Example 4 | ITZO | 25 | No peeling occurred | 9.83 |
| Comparative Example 1 | ITO | 40 | Partial peeling occurred | 5.09 |
| Comparative Example 2 | ITO | 100 | No peeling occurred | 1.11 |

Table 1 revealed that no peeling could be seen when the ITO film had a thickness of 35 nm or less, and the adhesiveness therebetween was strong. Table 1 revealed that the adhesiveness between the ITO film and the Molybdenum film worsened rapidly when the ITO film had a thickness of more than 35 nm.

Evaluation Example

Multilayer bodies were produced under the same conditions as those in Example 1, except that the thicknesses of the ITO film was changed to 30 nm and 100 nm. The multilayer bodies obtained were patterned by the following method and taper angles of the ITO films were measured.
1. Pure water cleaning: A multilayer body was washed with a pure water shower for five minutes, followed by drying with air.
2. UV cleaning: Organic materials on the surface of the resultant multilayer body were removed with ultraviolet (UV) irradiation.
3. Resist coating: Resist HPR-204 (novolac-quinone diazide based photoresist supplied by Philip A. Hunt Chemical Co., 8 cps product) was applied by spin coating.
4. Prebake: The resist was cured in an electric oven at 80° C. for 15 minutes.
5. Exposure: A halftone mask capable of intermediate exposure was put on the multilayer body, followed by irradiating ultraviolet (UV) light.
6. Development: An unnecessary resist part was removed with developer FHD-5 (supplied by FUJIFILM Co.), followed by cleaning with a pure water shower and drying with air.
7. Postbake: The residual resist was further cured in an electric oven at 150° C. for 15 minutes.
8. PAN etching: Wet etching was conducted with a mixed acid based etchant (a mixed acid Al etchant (phosphoric acid: acetic acid:nitric acid:water=73/3/7/17 (PAN) supplied by KANTO CHEMICAL Co., Inc.), and then an unnecessary molybdenum part was removed, followed by cleaning with a pure water shower and drying with air.
9. ITO etching: Wet etching was conducted with an oxalic acid based etchant (ITO-06N (oxalic acid:water=5% or less: 95% or more) supplied by KANTO CHEMICAL Co., Inc.), and an unnecessary ITO part was removed by using the molybdenum as a mask, followed by cleaning with a pure water shower and drying with air.
10. Peeling: Only the intermediate-exposed resist part was peeled with a resist peeling liquid (resist peeling liquid 106 supplied by TOKYO OHKA KOGYO CO., LTD.), followed by cleaning with a pure water shower and drying with air.
11. PAN etching: Wet etching was conducted with a mixed acid based etchant (a mixed acid Al etchant (phosphoric acid: acetic acid:nitric acid:water=73/3/7/17 (PAN) supplied by KANTO CHEMICAL Co., Inc.), and then an unnecessary molybdenum part was removed, followed by cleaning with a pure water shower and drying with air.
12. Peeling: All resist part was peeled with a resist peeling liquid (resist peeling liquid 106 supplied by TOKYO OHKA KOGYO CO., LTD.), followed by cleaning with a pure water shower and drying with air.

The taper angle of the ITO thin film patterned by the above-mentioned method was measured with an SEM (scanning electron microscope). The taper angle of 30 nm thick ITO film was 80°. The taper angle of 100 nm thick ITO film was 150°.

INDUSTRIAL APPLICABILITY

The multilayer structure of the invention can be used as an electrode for an electrical circuit of an electronic device, and can be used for producing an electric circuit of an electronic device using the electrode.

The invention claimed is:
1. A multilayer structure comprising:
a glass substrate; and
a multilayer thin film on the glass substrate;
wherein the multilayer thin film comprises an amorphous transparent conductive thin film and a molybdenum metal thin film, wherein the transparent conductive thin film is in contact with the molybdenum metal thin film, and
wherein the transparent conductive thin film comprises a thin film containing indium oxide and tin oxide; a thin film containing indium oxide, tin oxide, and zinc oxide; or a thin film containing indium oxide and an oxide of a rare earth element,
wherein the transparent conductive thin film and molybdenum metal thin film are sequentially formed by sputtering, and
wherein the transparent conductive thin film having a thickness of 25 nm to 1 nm.
2. The multilayer structure according to claim 1 wherein a taper angle of the transparent conductive thin film is less than 90°.
3. An electrode for an electrical circuit comprising the multilayer structure according to claim 1.
4. An electronic device comprising, as at least part thereof, an electrical circuit comprising the electrode for an electrical circuit according to claim 3.
5. An electronic device comprising, as at least part thereof, the multilayer structure according to claim 1.
6. The multilayer structure according to claim 1 wherein the molybdenum metal thin film has a thickness of 10 to 500 nm.
7. The multilayer structure according to claim 1 wherein the molybdenum metal thin film has a thickness of 20 to 200 nm.
8. The multilayer structure according to claim 1 wherein the transparent conductive thin film has a thickness of less than 10 nm to 1 nm.

* * * * *